United States Patent [19]

(12) United States Patent
Noma et al.

(10) Patent No.: US 8,044,440 B2
(45) Date of Patent: Oct. 25, 2011

(54) SEMICONDUCTOR DEVICE AND METHOD OF MANUFACTURING THE SAME

(75) Inventors: Takashi Noma, Ota (JP); Hiroyuki Shinogi, Gifu (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 38 days.

(21) Appl. No.: 12/476,790

(22) Filed: Jun. 2, 2009

(65) Prior Publication Data
US 2009/0302329 A1 Dec. 10, 2009

(30) Foreign Application Priority Data
Jun. 6, 2008 (JP) ................... 2008-148859

(51) Int. Cl.
*H01L 27/148* (2006.01)
(52) U.S. Cl. ........................ 257/233; 257/292
(58) Field of Classification Search ............ 257/81, 257/233
See application file for complete search history.

(56) References Cited

U.S. PATENT DOCUMENTS

| | | | | |
|---|---|---|---|---|
| 5,055,894 A | * | 10/1991 | Chan ....................... | 257/85 |
| 6,881,979 B2 | * | 4/2005 | Starikov et al. ........... | 257/80 |
| 2003/0080341 A1 | * | 5/2003 | Sakano et al. ............ | 257/79 |
| 2006/0255280 A1 | * | 11/2006 | Shibayama .............. | 250/370.11 |
| 2008/0220535 A1 | * | 9/2008 | LeBoeuf et al. .......... | 436/164 |
| 2009/0272430 A1 | * | 11/2009 | Cornfeld et al. .......... | 136/255 |

FOREIGN PATENT DOCUMENTS
JP 2001-183458 A 7/2001

OTHER PUBLICATIONS
Japanese Patent [06-132330] [machine's translation].*

* cited by examiner

*Primary Examiner* — Brook Kebede
*Assistant Examiner* — Tony Tran
(74) *Attorney, Agent, or Firm* — Morrison & Foerster LLP

(57) ABSTRACT

The invention is directed to providing a smaller semiconductor device formed as an optical sensor including a light receiving portion and a light emitting portion. A light receiving portion and a light emitting portion are disposed on a front surface of a semiconductor substrate for forming a semiconductor die, and a supporting body is attached to these so as to face these with an adhesive being interposed therebetween. A first opening exposing the light receiving portion from the front side of the supporting body is provided, and in a separated position therefrom, a second opening exposing the light emitting portion from the front side of the supporting body is provided. A first electrode and a second electrode are further disposed on the front surface of the semiconductor substrate, and bump electrodes electrically connected to these are disposed on the back surface of the semiconductor substrate.

8 Claims, 6 Drawing Sheets

SEMICONDUCTOR DEVICE AND METHOD OF MANUFACTURING THE SAME

CROSS-REFERENCE OF THE INVENTION

This application claims priority from Japanese Patent Application No. 2008-148859, the content of which is incorporated herein by reference in its entirety.

BACKGROUND OF THE INVENTION

1. Field of the Invention

The invention relates to a semiconductor device and a method of manufacturing the same, particularly to an optical sensor which measures a position of an object by irradiating the object with light from a light emitting portion and sensing the reflected light by a light receiving portion, and a method of manufacturing the same.

2. Description of the Related Art

An optical sensor is known as one of means of measuring a position of an object. This optical sensor has a light receiving portion and a light emitting portion, and detects a position of an object to be measured by, for example, irradiating the object with an optical pulse by the light emitting portion, sensing the luminance or phase of the optical pulse reflected by the object by the light receiving portion, and using the difference between the luminances or phases of both the optical pulses.

For example, such an optical sensor is applied to a technology of automatically sensing a distance between a user and a sound collecting microphone of a mobile and optimizing the phone volume according to the distance. In this technology, the optical sensor is provided near the sound collecting microphone of the mobile, and the luminance or the like of reflected light of light emitted to the user by the light emitting portion of the optical sensor is measured by the light receiving portion of the optical sensor, thereby measuring the distance between the user and the sound collecting microphone.

When such an optical sensor is realized by a semiconductor device, as shown in FIG. 12, a light receiving die (i.e. a semiconductor die) 101 including a light receiving element such as a photodiode is mounted as the light receiving portion on an elongated rectangular mounting substrate 100, and a light emitting die (i.e. other semiconductor die) 102 including a light emitting element such as an LED is separately mounted thereon as the light emitting portion.

An optical sensor for detecting a position of an object to be measured is described in Japanese Patent Application Publication No. 2001-183458.

In the optical sensor described above, however, since the light receiving die 101 and the light emitting die 102 are mounted on the mounting substrate 100 as separate semiconductor dies, it is necessary to secure a wide mounting region. This makes it difficult to reduce the size of the optical sensor.

SUMMARY OF THE INVENTION

The invention provides a semiconductor device that includes a semiconductor substrate having a front surface which comprises a first region and a second region that is separated from the first region, a light receiving portion disposed on the front surface in the first region, a light emitting portion disposed on the front surface in the second region, an insulation film covering the front surface of the semiconductor substrate, an electrode disposed on the insulation film, a supporting body attached to the front surface of the semiconductor substrate, an adhesive layer attaching the supporting body to the front surface so as to cover the insulation film and the electrode, and a bump electrode disposed on a back surface of the semiconductor substrate and electrically connected to the electrode. A first opening is formed to penetrate the supporting body and the adhesive layer so as to expose the light receiving portion, and a second opening is formed to penetrate the supporting body and the adhesive layer so as to expose the light emitting portion. The first opening is different from the second opening.

The invention also provides a method of manufacturing a semiconductor device. The method includes forming a light receiving portion on a front surface of a semiconductor substrate, forming an insulation film covering the semiconductor substrate, forming an electrode on the insulation film, applying an adhesive layer on the front surface of the semiconductor substrate, attaching a supporting body to the front surface of the semiconductor substrate with the adhesive layer so as to cover the insulation film and the electrode, forming a first opening in the supporting body and the adhesive layer so as to expose the light receiving portion, forming a second opening in the supporting body and the adhesive layer away from the first opening, placing a light emitting portion on the semiconductor substrate in the second opening, forming a bump electrode on a back surface of the semiconductor substrate so as to be electrically connected to the electrode, and dicing the semiconductor substrate and the supporting body so as to produce a semiconductor die having the first and second openings.

The invention further provides a semiconductor device that includes a first substrate having a first opening and a second opening different from the first opening, a second substrate made of a semiconductor and attached to the first substrate so as to cover the first and second opening, a light emitting portion formed on the semiconductor substrate and configured to receive light through the first opening, and a light emitting portion accommodated in the second opening and configured to emit light through the second opening.

DETAILED DESCRIPTION OF THE INVENTION

An embodiment of the invention will be described referring to figures. FIGS. 1 to 9 and FIG. 11 are cross-sectional views showing a semiconductor device of the embodiment, i.e., a semiconductor die formed as an optical sensor and a method of manufacturing the same. These figures mainly show a region of a wafer-shaped semiconductor substrate 10 which is to be formed with one of a plurality of semiconductor devices, i.e., semiconductor dies 1.

Figure 1:
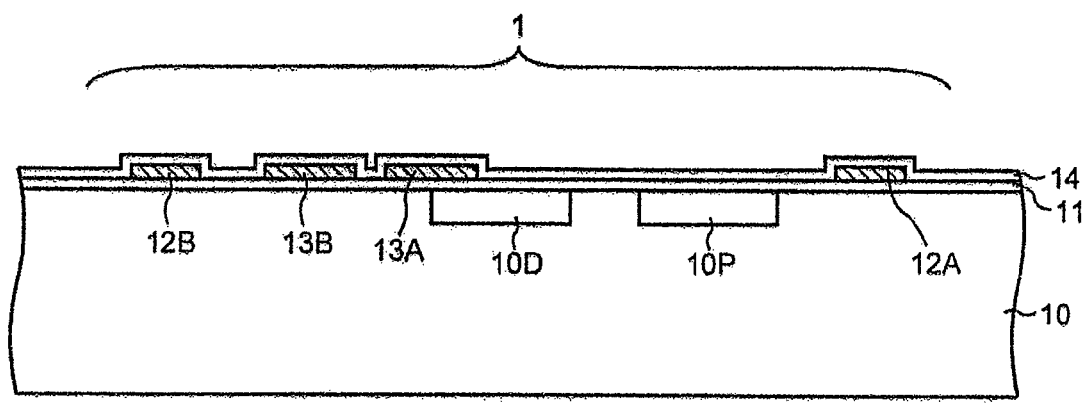
FIGS. 1 to 9 and 11 are cross-sectional views showing a semiconductor device and a method of manufacturing the same of an embodiment of the invention.

First, as shown in FIG. 1, a semiconductor substrate 10 made of a silicon substrate having a thickness of, for example, about 600 μm is provided. Then, in the region to be formed with the semiconductor die 1, a light receiving portion 10P is formed on a part of the front surface of the semiconductor substrate 10. The light receiving portion 10P includes a photodiode of, for example, a PN junction as a light receiving element. The light receiving portion 10P includes one or a plurality of light receiving elements. However, the light receiving portion 10P may include other light receiving element without limited to a photodiode. Hereafter, the description is given based on an embodiment where the light receiving portion 10P includes a photodiode of a PN junction as a light receiving element.

Furthermore, a control circuit 10D driving the light receiving portion 10P such as a microcomputer may be formed on the front surface of the semiconductor substrate 10. This control circuit 10D is not necessarily formed, and may be provided outside the semiconductor die 1 as an external circuit.

Then, a first insulation film 11 covering the light receiving portion 10P, the control circuit 10D and the semiconductor substrate 10 is formed. The first insulation film 11 is made of a BPSG film having a thickness of about 1 μm, for example. A first electrode 12A is formed on the first insulation film 11 outside the light receiving portion 10P, and a second electrode 12B is formed on the opposite side from the first electrode 12A.

Furthermore, a third electrode 13A and a fourth electrode 13B are formed on the first insulation film 11 between the light receiving portion 10P and the second electrode 12B. Then, a passivation film 14 such as a silicon nitride film is formed so as to cover the first to fourth electrodes 12A, 12B, 13A and 13B, and the front surface of the first insulation film 11.

Figure 2:
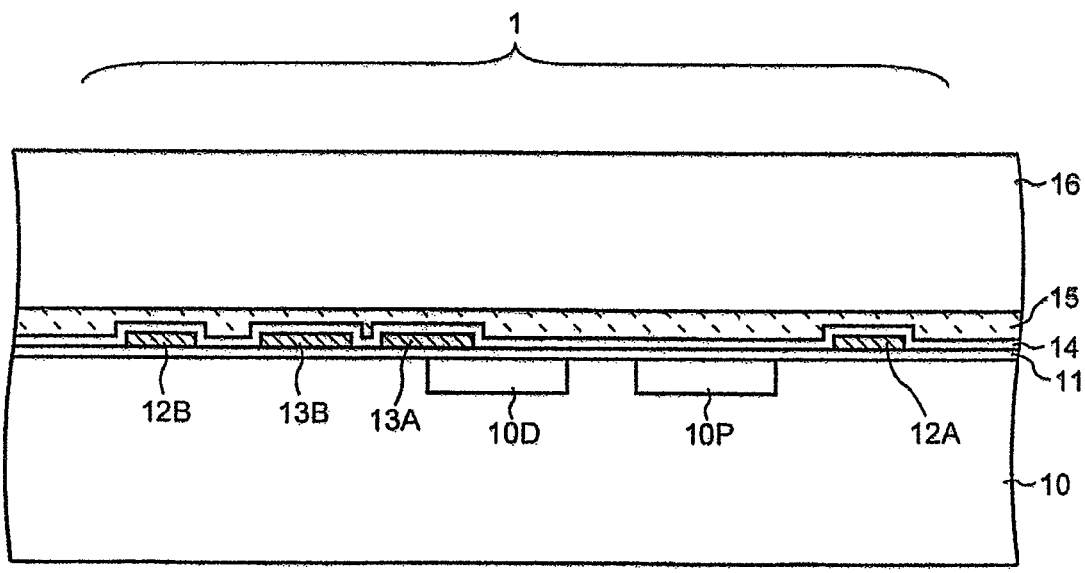

Then, as shown in FIG. 2, an adhesive 15 containing organic resin or the like is coated on the passivation film 14, and a supporting body 16 is attached to the front surface of the semiconductor substrate 10 so as to face it with this adhesive 15 being interposed therebetween. The supporting body 16 is made of a material transmitting light or a material not transmitting light. Preferably, the supporting body 16 is made of a silicon substrate not transmitting light. The supporting body 16 has a thickness of about 100 to 600 μm, for example.

Figure 3:
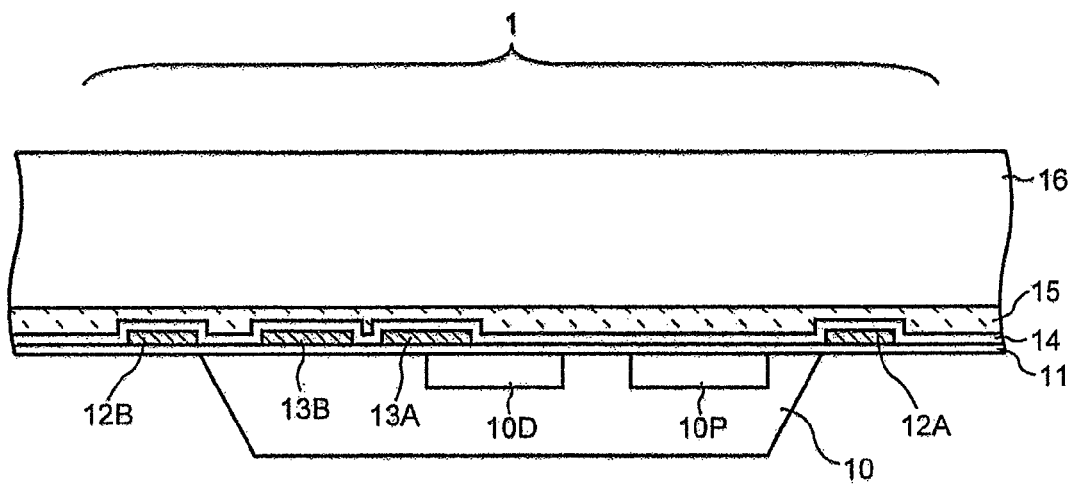

Then, as shown in FIG. 3, back surface grinding is performed to the semiconductor substrate 10 attached to the supporting body 16 so as to reduce its thickness to 10 to 150 μm, for example. Furthermore, a region of the semiconductor substrate 10 from the first electrode 12A to one end of the semiconductor die 1 and a region from the second electrode 12B to other end of the semiconductor die 1 are etched and removed. By this, the first insulation film 11 is exposed in these regions. The side surfaces of the semiconductor substrate 10 in these regions are preferably formed to provide a tapered shape toward the supporting body 16. This enhances the coverage of layers which are to be formed so as to cover the semiconductor substrate 10 and the supporting body 16 in the subsequent processes.

Figure 4:
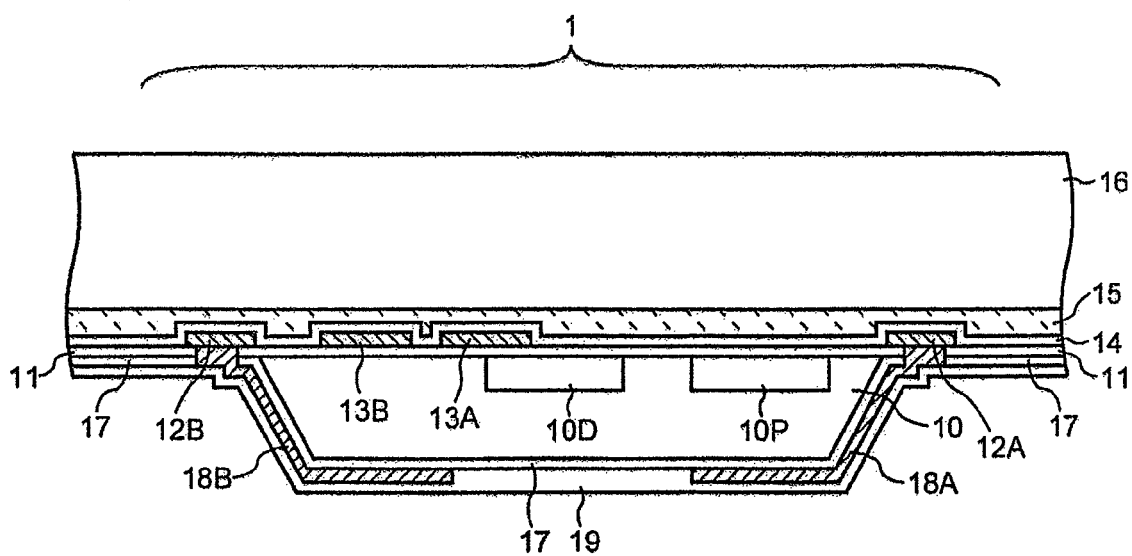

Then, as shown in FIG. 4, a second insulation film 17 covering the semiconductor substrate 10 and the first insulation film 11 is formed. The second insulation film 17 is made of a silicon oxide film formed by a CVD method, for example. The first insulation film 11 and the second insulation film 17 are then partially etched and removed to expose the back surfaces of the first electrode 12A and the second electrode 12B.

Then, wirings 18A and 18B connected to the first electrode 12A and the second electrode 12B and extending onto the back surface of the semiconductor substrate 10 are formed on the second insulation film 17. The wirings 18A and 18B are made of aluminum and formed by a sputtering method, for example. Furthermore, a third insulation film 19 is formed so as to cover these. The third insulation film 19 is made of a silicon oxide film formed by a CVD method, for example.

Figure 5:
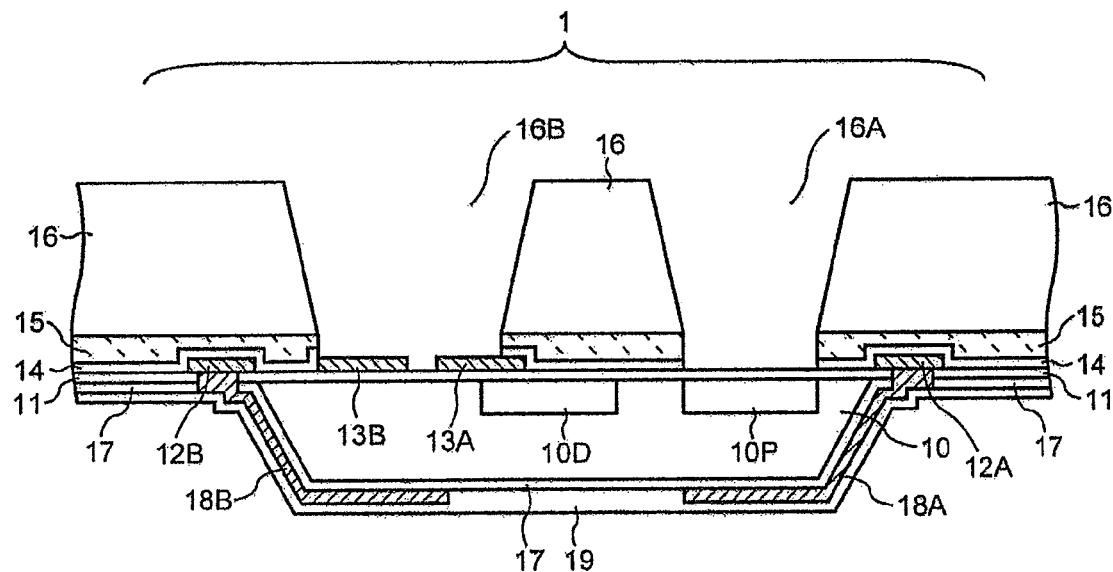

Then, as shown in FIG. 5, the supporting body 16, the adhesive 15 and the passivation film 14 are partially etched to form a first opening 16A penetrating these and exposing the light receiving portion through the first insulation film 11. At the same time, in a separated region from the first opening 16A, the supporting body 16, the adhesive 15 and the passivation film 14 are partially etched to form a second opening 16B penetrating these and exposing the third electrode 13A and the fourth electrode 13B. At this time, it is preferable to form the first opening 16A and the second opening 16B so as to have a tapered shape. Furthermore, in the first opening 16A, the first insulation film 11 may also be etched and removed.

Alternatively, the passivation film 14 may be previously formed with openings exposing the first insulation film 11, the third electrode 13A and the fourth electrode 13B before the supporting body 16 is attached. In this case, the second opening 16B exposing the third electrode 13A and the fourth electrode 13B is formed by partially etching the supporting body 16 and the adhesive 15. Furthermore, a plating layer (not shown) formed by, for example, layering nickel (Ni) and gold (Au) may be also previously formed on the third electrode 13A and the fourth electrode 13B.

Figure 6:
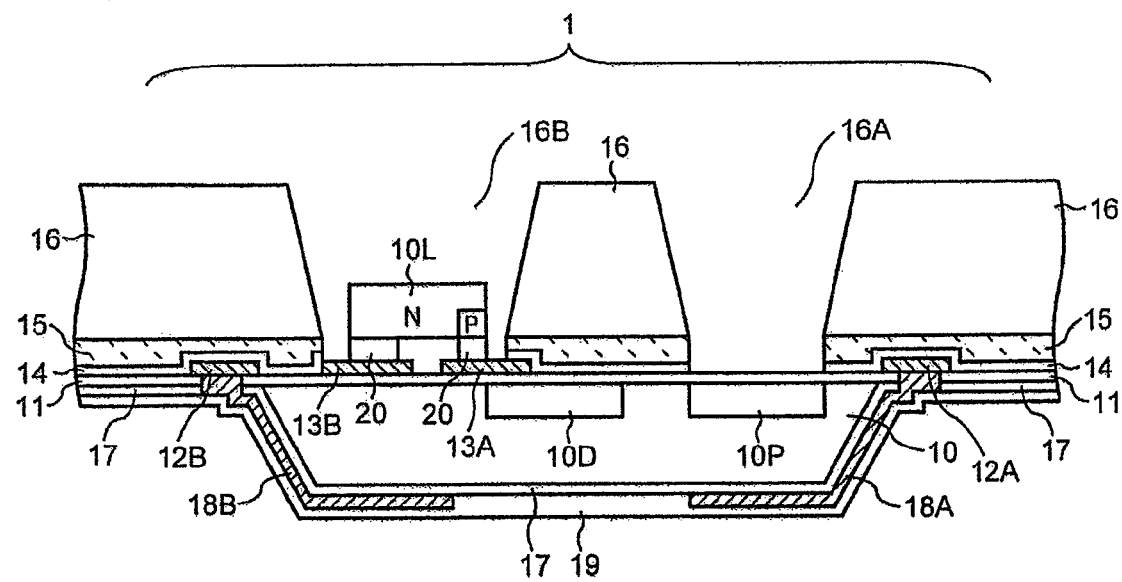

Then, as shown in FIG. 6, a light emitting portion 10L including a light emitting element such as an LED is placed on the bottom of the second opening 16B. The light emitting portion 10L includes one or a plurality of light emitting elements such as an LED, and in the case of including the plurality of light emitting elements, these light emitting elements may have different light emission bands. However, the light emitting portion 10L may include other light emitting element without limited to an LED. Hereafter, the description is given based on an embodiment where that the light emitting portion 10L includes an LED as a light emitting element. In this case, for example, an N type layer forming the PN junction of the LED is connected to the third electrode 13A through a metal bump 20 containing gold (Au) or the like, and a P type layer forming the PN junction is connected to the fourth electrode 13B through a metal bump 20. A plating layer formed by layering nickel (Ni) and gold (Au) is formed on the third electrode 13A and the fourth electrode 13B. A solder bump may be used as the metal bump 20 instead of the gold (Au) bump. Furthermore, silver paste may be formed instead of forming the plating layer.

When the first opening 16A and the second opening 16B are formed so as to have a tapered shape as in the example of the figures, light enters the light receiving portion 10P from multiple directions more easily and light is emitted from the light emitting portion 10L in multiple directions more easily, compared with a case of not having the tapered shape.

Furthermore, since the supporting body 16 is made of a silicon substrate not transmitting light in this example, the first opening 16A and the second opening 16B are shielded from each other from light, and the light receiving portion 10P in the first opening 16A does not directly sense light emitted by the light emitting portion 10L in the second opening 16B. On the contrary, in a case of the supporting body 16 made of a material transmitting light such as glass, the same effect as above is obtained by forming a reflection film reflecting light or a light shield film (both not shown) on the sidewalls of the first opening 16A and the second opening 16B.

Figure 7:
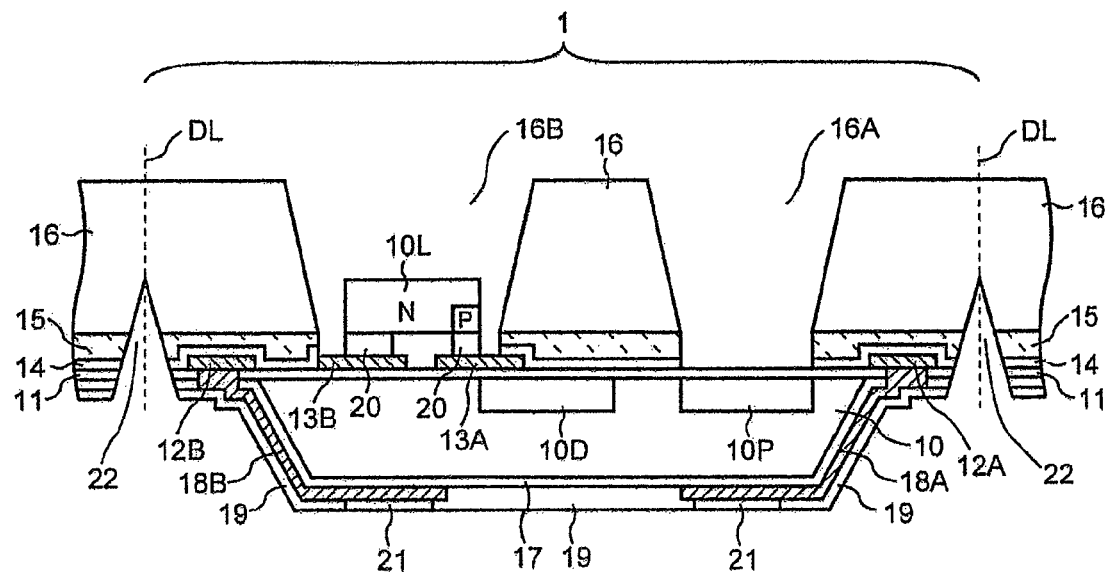

Then, as shown in FIG. 7, a part of the third insulation film 19 on the back surface of the semiconductor substrate 10 is removed by etching or the like to expose a part of the wirings 18A and 18B. Plating layers 21 formed by, for example, layering nickel (Ni) and gold (Au) are formed on the exposed wirings 18A and 18B. It is noted that this process of forming the plating layers 21 is not necessarily performed.

Then, the first insulation film 11, the passivation film 14, the adhesive 15 and the supporting body 16 are partially cut in the thickness direction along a dicing line DL of the semiconductor substrate 10 to form a groove 22. This groove 22 is formed so as not to reach the first electrode 12A and the second electrode 12B.

Figure 8:
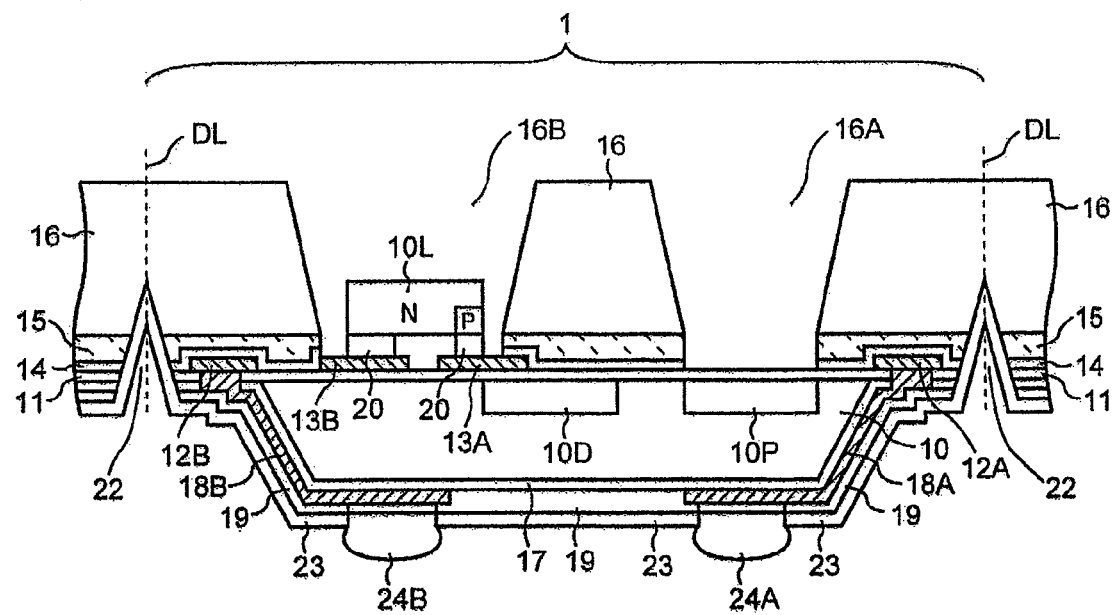

Then, as shown in FIG. 8, a protection film 23 extending on the first insulation film 11, on the third insulation film 19, and into the groove 22 is formed. Bump electrodes 24A and 24B made of solder or the like are formed on the protection film 23 covering the back surface of the semiconductor substrate 10. The bump electrodes 24A and 24B are connected to the plating layers 21 through openings provided in the protection film 23.

Figure 9:
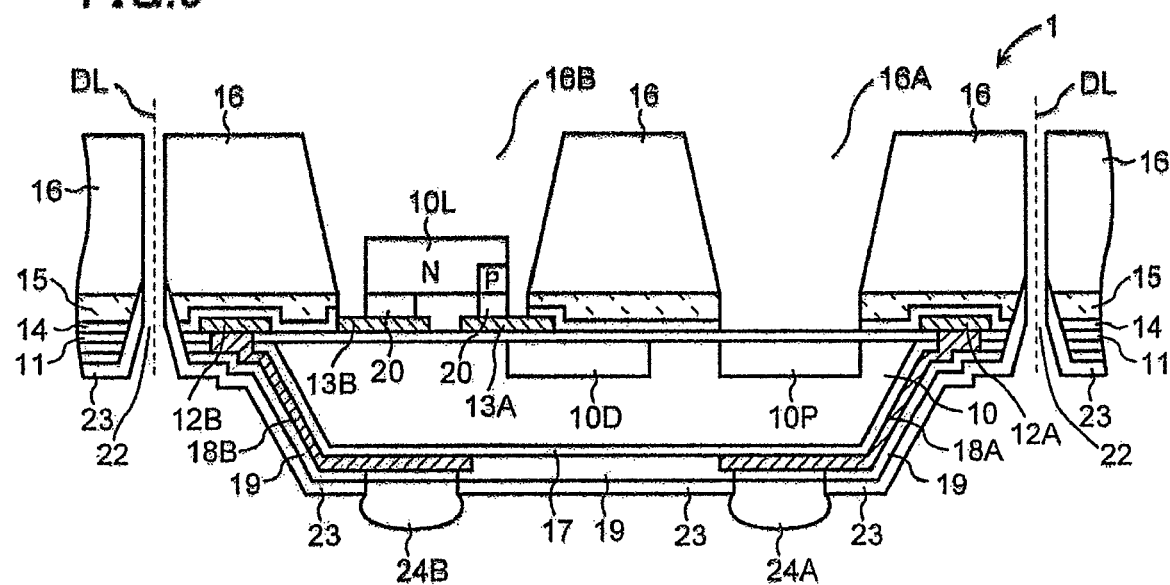

Then, as shown in FIG. 9, dicing is performed along the dicing line DL to divide the layered body including the semiconductor substrate 10 and the supporting body 16 into the semiconductor dies 1 each including the first opening 16A and the second opening 16B. In the dicing, only the protection film 23 and the supporting body 16 in the groove 22 are cut.

The optical sensor having the light receiving portion 10P and the light emitting portion 10L in one semiconductor die 1 is thus formed. This eliminates a need to separately mount a light receiving portion and a light emitting portion as semiconductor dies on a mounting substrate, thereby realizing a smaller optical sensor than conventional.

Furthermore, since the protection film 23 covers the ends of the first insulation film 11, the ends of the second insulation film 17, the ends of the passivation film 14, the ends of the adhesive 15, a part of the ends of the supporting body 16, and the third insulation film 19, which are exposed on the side surfaces of this semiconductor die 1, moisture is prevented from entering the semiconductor die 1.

When it is not necessary to consider a problem of moisture entering the semiconductor die 1 or corrosion, the process of forming the groove 22 described above may be omitted.

Figure 10:
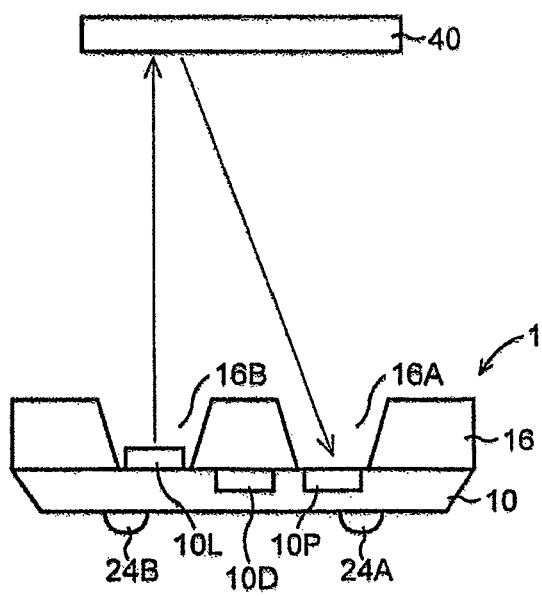
FIG. 10 is a cross-sectional view showing the semiconductor device of the embodiment of the invention.

Hereafter, an example of the operation of the optical sensor in the semiconductor die 1 described above will be described referring to a figure. FIG. 10 is a cross-sectional view showing the semiconductor device of the embodiment, which simply shows the semiconductor die 1 in FIG. 9.

As shown in FIG. 10, the light receiving portion 10P of the semiconductor die 1 senses light emitted by the light emitting portion 10L by the control of the control circuit 10D and then reflected by an object to be measured 40. Then, based on the luminance difference between the light emitted by the light emitting portion 10L and the light sensed by the light receiving portion 10P, the control circuit 10D calculates the distance between the object to be measured 40 and the semiconductor die 1.

Alternatively, periodic optical pulses may be emitted by the light emitting portion 10L by the control of the control circuit 10D, and the optical pulses reflected by the object to be measured 40 may be sensed by the light receiving portion 10P. In this case, the control circuit 10D compares the luminance and phase of the optical pulses emitted by the light emitting portion 10L with those of the optical pulses sensed by the light receiving portion 10P, and calculates the distance between the object to be measured 40 and the semiconductor die 1 based on the luminance difference and the phase difference.

Figure 11:
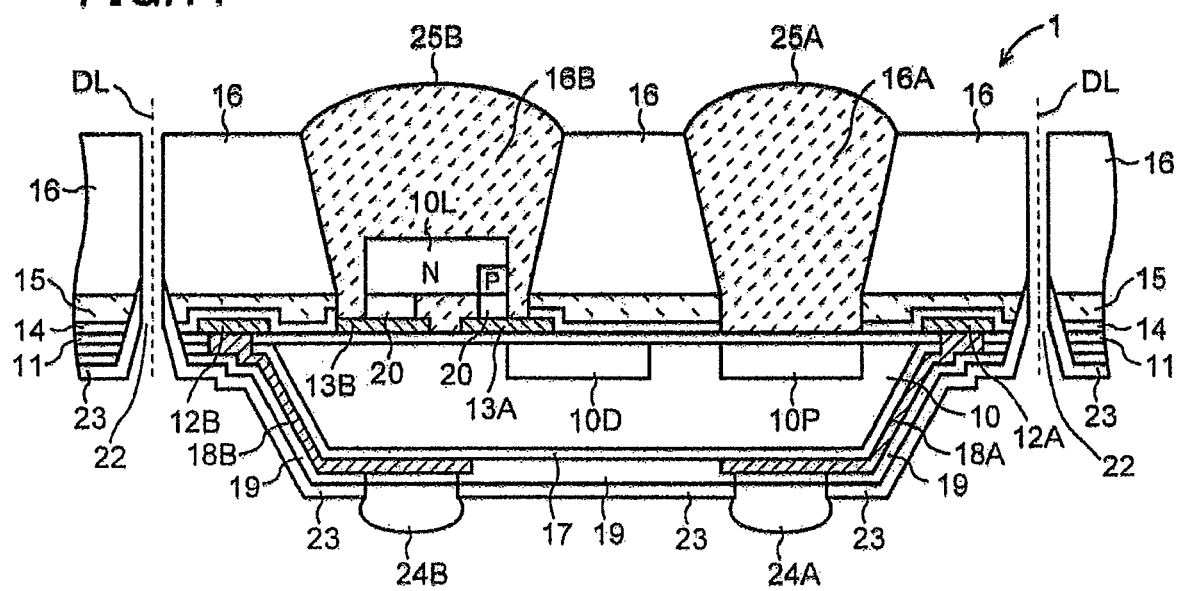
Figure 12:
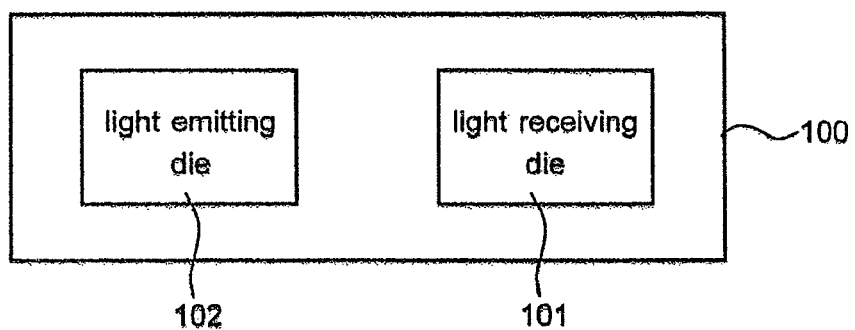
FIG. 12 is a cross-sectional view showing a semiconductor device and a method of manufacturing the same of a conventional art.

As shown in FIG. 11, the first opening 16A and the second opening 16B may be sealed 30 with fillers 25A and 25B transmitting light. This process is preferably performed before the process of forming the groove 22 shown in FIG. 7. The fillers 25A and 25B are made of transparent resin, for example.

Furthermore, the front surfaces of the fillers 25A and 25B exposed in the first opening 16A and the second opening 16B may be curved. In detail, the curved surface of the filler 25A exposed in the first opening 16A is formed so that external light is easily collected in the light receiving portion 10P from a wide angle. The curved surface of the filler 25B exposed in the second opening 16B is formed so that light generated by the light emitting portion 10L is emitted with high directivity.

In the invention, a light receiving portion and a light emitting portion for forming an optical sensor are integrally provided in one semiconductor device, i.e., in one semiconductor die, thereby reducing the size of the semiconductor device.

What is claimed is:

1. A semiconductor device comprising:
   a semiconductor substrate having a front surface which comprises a first region and a second region that is separated from the first region;
   a light receiving portion disposed on the front surface in the first region;
   a light emitting portion disposed on the front surface in the second region;
   an insulation film covering the front surface of the semiconductor substrate;
   an electrode disposed on the insulation film;
   a supporting body attached to the front surface of the semiconductor substrate;
   an adhesive layer comprising an organic resin and attaching the supporting body to the front surface so as to cover the insulation film and the electrode; and
   a bump electrode disposed on a back surface of the semiconductor substrate and electrically connected to the electrode,
   wherein a first opening is formed to penetrate the supporting body and the adhesive layer so as to expose the light receiving portion,
   a second opening is formed to penetrate the supporting body and the adhesive layer so as to expose the light emitting portion, and
   the first opening is different from the second opening.

2. The semiconductor device of claim 1, wherein the supporting body comprises a semiconductor substrate.

3. The semiconductor device of claim 1, further comprising light-transmitting fillers filling the first and second openings.

4. The semiconductor device of claim 3, wherein the fillers fill the first and second openings so as to form a curved top portion in each of the first and second openings.

5. The semiconductor device of claim 1, wherein the light receiving portion comprises a photodiode.

6. The semiconductor device of claim 1, wherein the light emitting portion comprises an LED.

7. The semiconductor device of claim 1, further comprising a protection film covering ends of the insulation film, the adhesive layer and the supporting body.

8. The semiconductor device of claim 1, further comprising a control circuit formed on the front surface of the semiconductor substrate and controlling at least one of the light receiving portion and the light emitting portion.

* * * * *